United States Patent
Riordon et al.

(10) Patent No.: US 11,982,359 B2
(45) Date of Patent: May 14, 2024

(54) ISOLATION VALVE

(71) Applicant: Applied Materials, Inc., Santa Clara, CA (US)

(72) Inventors: Benjamin Riordon, Newburyport, MA (US); Anantha K. Subramani, San Jose, CA (US); Charles T. Carlson, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/936,012

(22) Filed: Jul. 22, 2020

(65) Prior Publication Data

US 2021/0033197 A1     Feb. 4, 2021

Related U.S. Application Data

(60) Provisional application No. 62/881,181, filed on Jul. 31, 2019.

(51) Int. Cl.
    *F16K 1/20*        (2006.01)
    *F16K 49/00*      (2006.01)
    *H01L 21/67*      (2006.01)

(52) U.S. Cl.
CPC .......... *F16K 1/2042* (2013.01); *F16K 1/2007* (2013.01); *F16K 49/005* (2013.01); *H01L 21/67017* (2013.01)

(58) Field of Classification Search
CPC ........... F16K 1/18–2092; F16K 49/005; H01L 21/67017

(Continued)

(56) References Cited

U.S. PATENT DOCUMENTS 3,550,904 A * 12/1970 Vawter .................. F16K 1/2028
                                                                      251/298
3,566,908 A * 3/1971 Macnak ................ F16K 1/2085
                                                                      137/248

(Continued)

FOREIGN PATENT DOCUMENTS

JP        H11-148562 A      6/1999
JP        2006-322357 A    11/2006

(Continued)

OTHER PUBLICATIONS

International Search Report and Written Opinion dated Nov. 4, 2020 in International Patent Application No. PCT/US2020/042968, 9 pages.

(Continued)

*Primary Examiner* — Kevin F Murphy
*Assistant Examiner* — Jonathan J Waddy
(74) *Attorney, Agent, or Firm* — Kilpatrick Townsend & Stockton LLP

(57) ABSTRACT

Described are isolation valves, and chamber systems incorporating and methods of using the isolation valves. In some embodiments, an isolation valve may include a valve body and a flapper assembly. The valve body may define a first fluid volume, a second fluid volume, and a seating surface. The flapper assembly may include a flapper disposed inside the valve body having a flapper surface complimentary to the seating surface. The flapper may be pivotable within the valve body to a first position such that the flapper surface may be away from the seating surface to allow fluid flow between the first fluid volume and the second fluid volume. The flapper may be pivotable within the valve body to a second position such that the flapper surface may be proximate the seating surface to form a non-contact seal to restrict (Continued)

fluid flow between the first fluid volume and the second fluid volume.

20 Claims, 7 Drawing Sheets

(58) Field of Classification Search
USPC ........ 137/247.19; 251/121, 123; 138/43, 45, 138/46
See application file for complete search history.

(56) References Cited

U.S. PATENT DOCUMENTS

| | | | | |
|---|---|---|---|---|
| 5,205,532 | A * | 4/1993 | Naehring | F16K 51/02 251/298 |
| 5,939,831 | A * | 8/1999 | Fong | H01L 21/67017 134/1.1 |
| 6,629,682 | B2 | 10/2003 | Duelli | |
| 6,835,278 | B2 * | 12/2004 | Selbrede | C23C 16/52 134/1.1 |
| 9,028,648 | B1 * | 5/2015 | Kamakura | H01L 21/0228 156/345.33 |
| 9,818,601 | B1 * | 11/2017 | Tokunaga | H01L 21/0217 |
| 2001/0036393 | A1 | 11/2001 | Kroeker | |
| 2005/0274923 | A1 * | 12/2005 | Tanase | F16K 1/24 251/301 |
| 2006/0182534 | A1 * | 8/2006 | Hiroki | H01L 21/67126 414/217 |
| 2007/0144483 | A1 * | 6/2007 | Torii | F02M 35/10085 123/337 |
| 2008/0271501 | A1 * | 11/2008 | Roder | F16K 51/02 70/175 |
| 2011/0095220 | A1 | 4/2011 | Geiser | |
| 2011/0140023 | A1 * | 6/2011 | Sauer | F16K 51/02 251/298 |
| 2011/0186762 | A1 | 8/2011 | Geiser | |
| 2012/0042828 | A1 * | 2/2012 | Black | F16K 1/2007 118/715 |
| 2013/0045547 | A1 * | 2/2013 | Izawa | H01J 37/32972 156/345.28 |
| 2013/0190160 | A1 | 7/2013 | Yumoto et al. | |
| 2015/0275709 | A1 * | 10/2015 | Hodebourg | F16K 11/052 123/188.1 |
| 2018/0209328 | A1 * | 7/2018 | Lotz | F16K 1/42 |
| 2018/0339816 | A1 * | 11/2018 | Oldendorf | B65D 45/02 |

FOREIGN PATENT DOCUMENTS

| | | | |
|---|---|---|---|
| JP | 2019018996 A | 2/2019 | |
| KR | 2017-0097810 A | 8/2017 | |
| TW | I270926 B | 1/2007 | |
| TW | 2009-49003 A | 12/2009 | |
| TW | 2011-07638 A | 3/2011 | |
| WO | WO-2017097672 A1 * | 6/2017 | ............ F16K 3/18 |

OTHER PUBLICATIONS

International Preliminary Report on Patentability dated Feb. 10, 2022 in International Patent Application No. PCT/US2020/042968, 7 pages.

* cited by examiner

ISOLATION VALVE

CROSS-REFERENCE TO RELATED APPLICATIONS

The present application claims the benefit of, and priority to U.S. Provisional Patent Application No. 62/881,181, filed Jul. 31, 2019, the contents of which are hereby incorporated by reference in their entirety for all purposes.

TECHNICAL FIELD

The present technology relates to semiconductor processes and equipment. More specifically, the present technology relates to isolation valves for semiconductor processing and methods and systems utilizing the isolation valves.

BACKGROUND

Integrated circuits are made possible by processes which produce intricately patterned material layers on substrate surfaces. As device sizes continue to shrink in next-generation devices, uniformity of processing conditions continues to increase in importance, chamber designs and system set-up may have an important role in the quality of devices produced. Thus, there is a need for systems and methods that can be used to produce high quality devices and structures.

SUMMARY

According to one aspect, an isolation valve may include a valve body and a flapper assembly. The valve body may define a first fluid volume, a second fluid volume, and a seating surface. The flapper assembly may include a flapper disposed inside the valve body having a flapper surface complimentary to the seating surface. The flapper may be pivotable within the valve body to a first position such that the flapper surface may be away from the seating surface to allow fluid flow between the first fluid volume and the second fluid volume. The flapper may be further pivotable within the valve body to a second position such that the flapper surface may be proximate the seating surface to form a non-contact seal to restrict fluid flow between the first fluid volume and the second fluid volume.

In some embodiments, when the flapper may be in the second position, a gap ranging between 2 mm and 0.1 mm may be formed between the seating surface and the complimentary flapper surface to form the non-contact seal. In some embodiments, when the flapper may be in the second position, a ratio of a length of a flow path defined by the flapper surface and the seating surface to a distance between the flapper surface and the seating surface may range between about 1000:1 and about 10:1. In some embodiments, the flapper surface and the seating surface may be planar.

In some embodiments, the flapper assembly may further include a flapper shaft configured to pivot the flapper between the first position and the second position. The valve body may include a first sidewall that may define a first aperture for coupling with a first end portion of the flapper shaft. The valve body may further include a second sidewall opposite to the first sidewall. The second sidewall may define a second aperture for coupling with a second end portion of the flapper shaft. In some embodiments, the flapper assembly may further include a driving mechanism operable to drive the flapper shaft. The driving mechanism may be disposed outside the valve body and mounted on the exterior of the first sidewall. In some embodiments, the flapper and the flapper shaft may be formed as a unitary body.

In some embodiments, the flapper assembly may further include a flapper shaft for pivoting the flapper between the first position and the second position. The flapper shaft may include a hollow core configured to pass through a cooling fluid to cool the flapper shaft and the flapper. In some embodiments, the valve body may include a plurality of walls. A cooling loop may be disposed in at least one wall of the plurality of walls. The cooling loop may be configured to pass through a cooling fluid to cool the valve body.

In some embodiments, the valve body may further define a first port for providing fluid access to the first fluid volume and a second port for providing fluid access to the second fluid volume. The first port and the second port may define a common flow cross-sectional area, and the first port and the second port may be shaped differently. In some embodiments, the first port may be circular, and the second port may be rectangular. In some embodiments, the second port may include a first dimension parallel to a pivoting axis of the flapper and a second dimension perpendicular to the pivoting axis of the flapper. A ratio of the first dimension to the second dimension may range between about 10:1 and about 1:1.

In some embodiments, at least one of the valve body or the flapper may include at least one of aluminum, aluminum oxide, or aluminum nitride.

According to another aspect, a chamber system may include a first chamber unit, a second chamber unit, and an isolation valve. The isolation valve may be coupled to the first chamber unit and the second chamber unit and may be configured to control fluid flow between the first chamber unit and the second chamber unit. The isolation valve may include a valve body and a flapper. The valve body may define a first port providing fluid access to the first chamber unit, and a second port providing fluid access to the second chamber unit. The flapper may be disposed inside the valve body and may have a flapper surface. The flapper may be pivotable within the valve body to a first position such that the flapper surface may be away from a seating surface defined by the valve body to allow fluid flow between the first chamber unit and the second chamber unit. The flapper may be further pivotable within the valve body to a second position such that the flapper surface may be proximate the seating surface to restrict fluid flow between the first chamber unit and the second chamber unit. When the flapper may be in the second position, the seating surface and the flapper surface may form a non-contact seal to restrict fluid flow between the first chamber unit and the second chamber unit.

In some embodiments, when the flapper may be in the second position, a ratio of a length of a flow path defined by the flapper surface and the seating surface to a distance between the flapper surface and the seating surface may range between about 1000:1 and about 10:1.

In some embodiments, the first chamber unit may include a remote plasma unit, and the second chamber unit may include a semiconductor processing chamber configured to produce a local plasma with the second chamber unit for semiconductor processing.

In some embodiments, the isolation valve may be a first isolation valve. The chamber system may further include a third chamber unit and a second isolation valve coupled to the first chamber unit and the third chamber unit and configured to control fluid flow between the first chamber unit and the third chamber unit.

According to a further aspect, a method, may include closing an isolation valve coupled with a first chamber unit and a second chamber unit. The isolation valve may be operable to control fluid flow between the first chamber unit and the second chamber unit. The isolation valve may include a valve body and a flapper. The valve body may define a first fluid volume fluidly coupled with the first chamber unit, and a second fluid volume fluidly coupled with the second chamber unit. The flapper may be disposed inside the valve body and may have a flapper surface. The flapper may be pivotable within the valve body to a first position such that the flapper surface may be away from a seating surface defined by the valve body to allow fluid flow between the first chamber unit and the second chamber unit. The flapper may be further pivotable within the valve body to a second position such that the flapper surface may be proximate the seating surface to restrict fluid flow between the first chamber unit and the second chamber unit. When the flapper may be in the second position, the seating surface and the flapper surface may form a non-contact seal to restrict fluid flow between the first chamber unit and the second chamber unit. The method may further include flowing a shielding gas into the first fluid volume.

In some embodiments, the shielding gas may be flowed at a flow rate ranging between about 200 sccm and about 5 sccm. In some embodiments, the method may further include dynamically control a flow rate of the shielding gas such that a pressure in the first fluid volume may be greater than a pressure in the second fluid volume.

The present technology may provide numerous benefits over conventional systems and techniques. For example, the present technology may achieve a non-contact seal that may operate reliably in a highly corrosive environment to prevent contamination by fluid flow across the isolation valve from one chamber unit to another. The present technology may also offer a simplified design that avoid the cooling and protective shielding that may be otherwise required in supporting an elastomeric contact seal. These and other embodiments, along with many of their advantages and features, may be described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
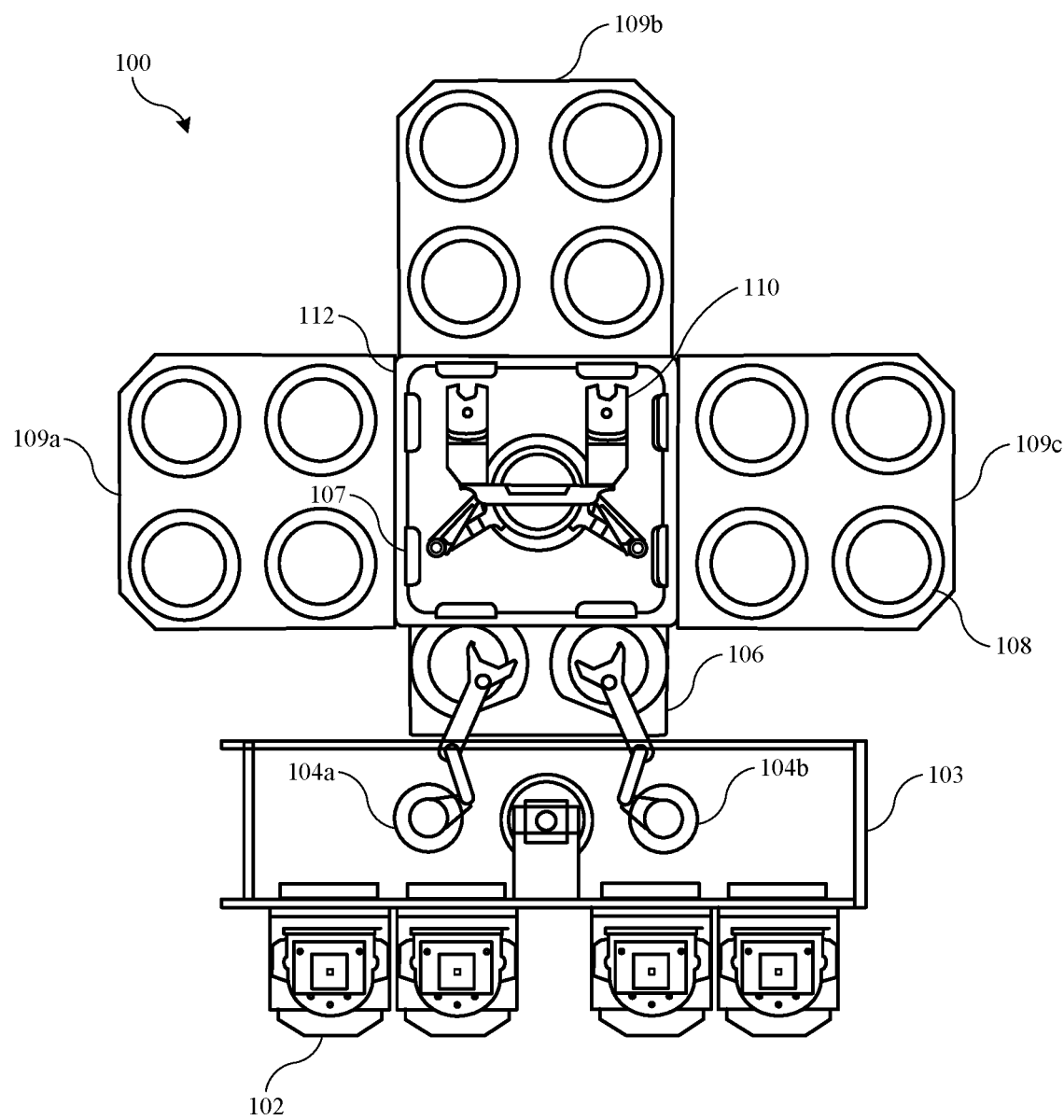
FIG. 1 shows a schematic top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor processing, processing gases, such as deposition gases, flowed into one processing unit or processing region may enter into another processing unit or region. For example, deposition gases flowed into a processing region of a chamber system may enter into a remote plasma unit of the chamber system, forming a coating inside the remote plasma unit. Thus, remote plasma sources, such as the remote plasma unit, can be a source of process contamination, because the coating formed during one process may be subsequently released back into the processing region during subsequent processes. Further, functional life of the remote plasma unit before maintenance or exchange may also be reduced.

Isolation valves may be implemented between the processing region and the remote plasma unit. However, conventional isolation valves may have a very short operational life because the elastomer seals utilized by conventional isolation valves may be damaged due to exposure to the corrosive chemicals and thermal recombination heating from the plasma effluents flowed from the remote plasma unit. Although a cooling circuit and/or a protective shield may be implemented to protect the elastomer seals, that may add manufacturing complexity and increase costs.

The present technology overcomes these issues by providing an isolation valve operable to close to protect the remote plasma source from contamination during semiconductor processing. When closed, the isolation valve may form a non-contact seal by forming a gap of very low fluid conductance. A shielding gas may be flowed into the isolation valve. When coupled with the low conductance of the gap formed by the isolation valve, the shield gas may prevent the processing gas from flowing through the gap into the remote plasma source.

Although the disclosure routinely identifies processing chambers or regions and remote plasma sources or units as chamber units that may be isolated from each other by the isolation valve described herein, the isolation valve may be utilized to isolate any two chamber units of a chamber system. Further, although exemplary semiconductor processing chambers and units are described to aid understanding of the present technology, the present technology should not be considered to be so limited as for isolating semiconductor processing chambers and/or units only. It is to be understood that the present technology can be utilized for providing isolation between any types of chambers, containers, or units.

FIG. 1 shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 2:
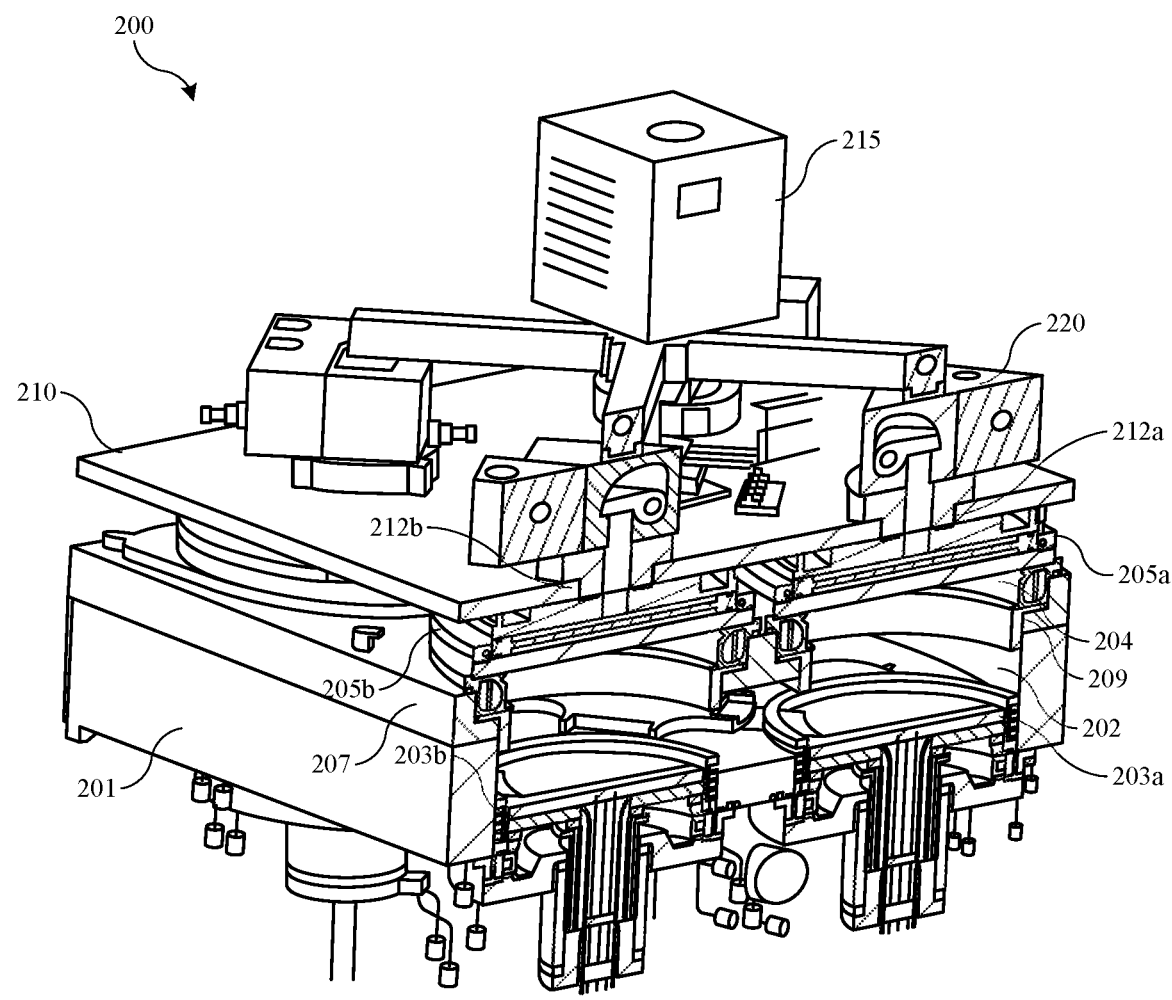
FIG. 2 shows a schematic partial isometric view of a chamber system according to some embodiments of the present technology.

FIG. 2 shows a schematic partial isometric view of chamber system 200 according to some embodiments of the present technology. The figure may illustrate a partial cross-section through two processing regions and a portion of a transfer region of the chamber system. For example, chamber system 200 may be a quad section of processing system 100 described previously, and may include any of the components of any of the previously described components or systems.

Chamber system 200 may include a chamber body 201 defining a transfer region 202 including substrate supports 203, which may extend into the chamber body 201 and be vertically translatable. First lid plate 207 may be seated overlying the chamber body 201, and may define apertures 209 producing access for processing region 204 to be formed with additional chamber system components. Seated about or at least partially within each aperture may be a lid stack 205, and chamber system 200 may include a plurality of lid stacks 205, including a number of lid stacks equal to a number of apertures 209 of the plurality of apertures. Each lid stack 205 may be seated on the first lid plate 207, and may be seated on a shelf produced by recessed ledges through a second surface of the first lid plate 207. The lid stacks 205 may at least partially define processing regions 204 of the chamber system 200.

As illustrated, processing regions 204 may be vertically offset from the transfer region 202, but may be fluidly coupled with the transfer region. Additionally, the processing regions may be separated from the other processing regions. Although the processing regions may be fluidly coupled with other processing regions through the transfer region from below, the processing regions may be fluidly isolated, from above, from each of the other processing regions. Each lid stack 205 may also be aligned with a substrate support in some embodiments. For example, as illustrated, lid stack 205a may be aligned over substrate support 203a, and lid stack 205b may be aligned over substrate support 203b. When raised to operational positions, such as a second position, the substrates may be delivered for individual processing within the separate processing regions. When in this position, each processing region 204 may be at least partially defined from below by an associated substrate support in the second position.

FIG. 2 also illustrates embodiments in which a second lid plate 210 may be included for the chamber system. Second lid plate 210 may be coupled with each of the lid stacks, which may be positioned between the first lid plate 207 and the second lid plate 210 in some embodiments. The second lid plate 210 may facilitate accessing components of the lid stacks 205. Second lid plate 210 may define a plurality of apertures 212 through the second lid plate. Each aperture of the plurality of apertures may be defined to provide fluid access to a specific lid stack 205 or processing region 204. A remote plasma unit 215 may optionally be included in chamber system 200 in some embodiments, and may be supported on second lid plate 210. In some embodiments, remote plasma unit 215 may be fluidly coupled with each aperture 212 of the plurality of apertures through second lid plate 210. Isolation valves 220 may be included along each fluid line to provide fluid control to each individual processing region 204. For example, as illustrated, aperture 212a may provide fluid access to lid stack 205a. Aperture 212a may also be axially aligned with any of the lid stack components, as well as with substrate support 203a in some embodiments, which may produce an axial alignment for each of the components associated with individual processing regions, such as along a central axis through the substrate support or any of the components associated with a particular processing region 204. Similarly, aperture 212b may provide fluid access to lid stack 205b, and may be aligned, including axially aligned with components of the lid stack as well as substrate support 203b in some embodiments.

Figure 3:
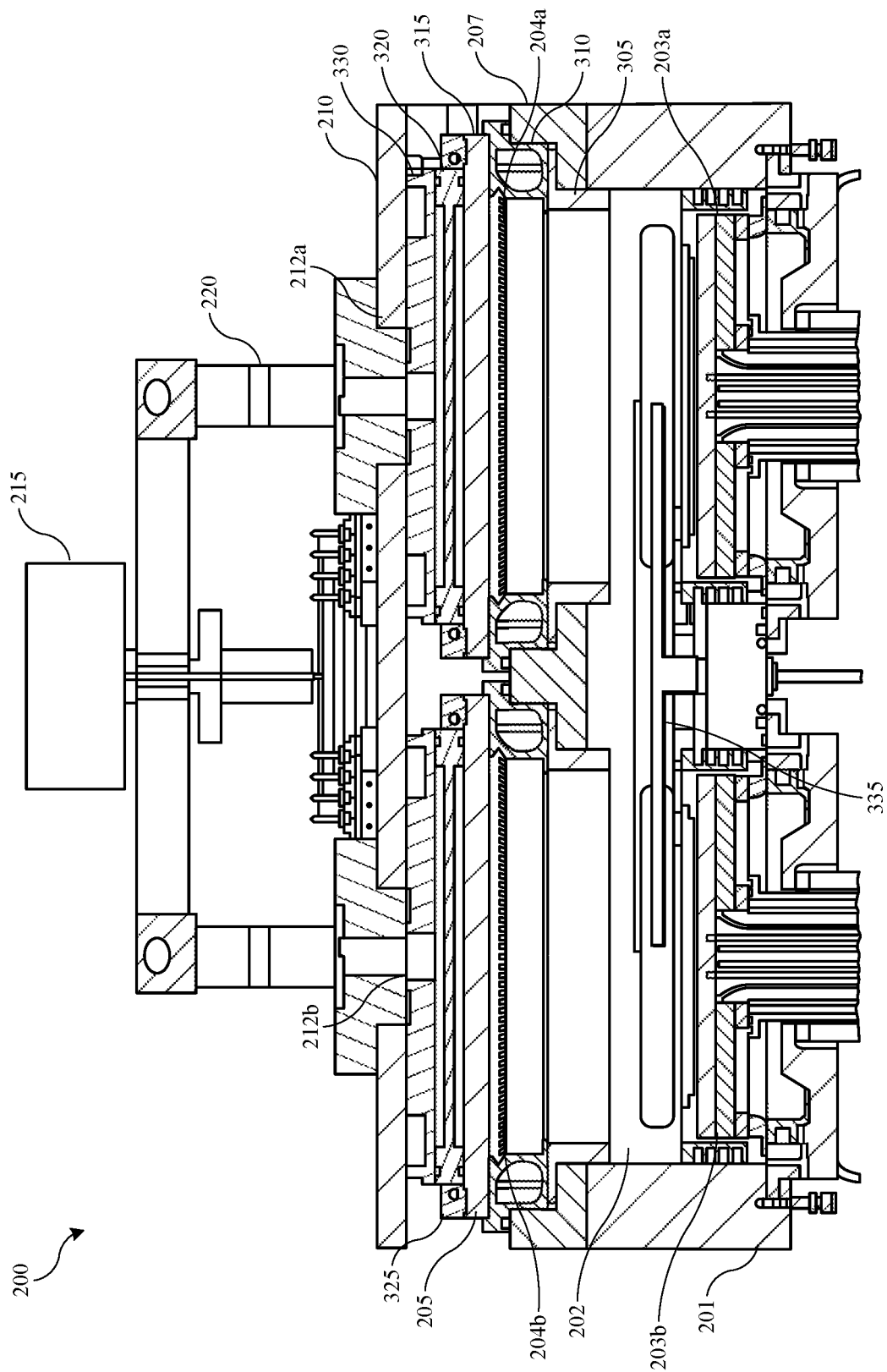
FIG. 3 shows a schematic partial cross-sectional view of an exemplary chamber system according to some embodiments of the present technology.

FIG. 3 shows a schematic cross-sectional elevation view of one embodiment of chamber system 200 according to some embodiments of the present technology. FIG. 3 may illustrate the cross-sectional view shown above in FIG. 2, and may further illustrate components of the system. The figure may include components of any of the systems illustrated and described previously, and may also show further aspects of any of the previously described systems. It is to be understood that the illustration may also show exemplary components as would be seen through any two adjacent processing regions 108 in any quad section 109 described above. The elevation view may illustrate the configuration or fluid coupling of one or more processing regions 204 with a transfer region 202. For example, a continuous transfer region 202 may be defined by chamber body 201. The housing may define an open interior volume in which a number of substrate supports 203 may be disposed. For example, as illustrated in FIG. 1, exemplary processing systems may include four or more, including a plurality of substrate supports 203 distributed within the chamber body about the transfer region. The substrate supports may be pedestals as illustrated, although a number of other configurations may also be used. In some embodiments the pedestals may be vertically translatable between the transfer region 202 and the processing regions 204 overlying the transfer region. The substrate supports may be vertically translatable along a central axis of the substrate support along a path between a first position and a second position within the chamber system. Accordingly, in some embodiments each substrate support 203 may be axially aligned with an overlying processing region 204 defined by one or more chamber components.

The open transfer region may afford the ability of a transfer apparatus 335, such as a carousel, to engage and move substrates, such as rotationally, between the various substrate supports. The transfer apparatus 335 may be rotatable about a central axis. This may allow substrates to be positioned for processing within any of the processing regions 204 within the processing system. The transfer apparatus 335 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 335 and deliver the substrates into the processing regions 204, which may be vertically offset from the transfer region 202. For example, and as illustrated, substrate support 203a may deliver a substrate into processing region 204a, while substrate support 203b may deliver a substrate into processing region 204b. This may occur with the other two substrate supports and processing regions, as well as with additional substrate supports and processing regions in embodiments for which additional processing regions are included. In this configuration, the substrate supports may at least partially define a processing region 204 from below when operationally engaged for processing substrates, such as in the second position, and the processing regions may be axially aligned with an associated substrate support. The processing regions may be defined from above by the components of the lid stacks 205, which may each include one or more of the illustrated components. In some embodiments, each processing region may have individual lid stack components, although in some embodiments components may accommodate multiple processing regions 204. Based on this configuration, in some embodiments each processing region 204 may be fluidly coupled with the transfer region, while being fluidly isolated from above from each other processing region within the chamber system or quad section.

The lid stack 205 may include a number of components, which may facilitate flow of precursors through the chamber system, and may be at least partially contained between the first lid plate 207 and the second lid plate 210. A liner 305 may be seated directly on the shelf formed by each recessed ledge in first lid plate 207. For example, liner 305 may define a lip or flange, which may allow liner 305 to extend from the shelf of first lid plate 207. Liner 305 may extend vertically below the first surface of first lid plate 207 in some embodiments, and may at least partially extend into the open transfer region 202. The liner 305 may be made of materials similar or different from the chamber body materials, and may be or include materials that limit deposition or retention of materials on the surface of liner 305. Liner 305 may define an access diameter for substrate support 203, and may be characterized by any of the gap amounts described above for clearance between the substrate support 203 and the liner 305 when included.

Seated on the liner 305 may be a pumping liner 310, which may at least partially extend within the recess or along the recessed ledge defined in the second surface of first lid plate 207. In some embodiments, pumping liner 310 may be seated on liner 305 on the shelf formed by the recessed ledge. Pumping liner 310 may be an annular component, and may at least partially define the processing region 204 radially, or laterally depending on the volume geometry. The pumping liner may define an exhaust plenum within the liner, which may define a plurality of apertures on an inner annular surface of the pumping liner providing access to the exhaust plenum. The exhaust plenum may at least partially extend vertically above a height of the first lid plate 207, which may facilitate delivering exhausted materials through an exhaust channel formed through the first lid plate and chamber body as previously described. A portion of the pumping liner may at least partially extend across the second surface of the first lid plate 207 to complete the exhaust channel between the exhaust plenum of the pumping liner, and the channel formed through the chamber body and first lid plate.

A faceplate 315 may be seated on the pumping liner 310, and may define a plurality of apertures through the faceplate 315 for delivering precursors into the processing region 204. Faceplate 315 may at least partially define an associated processing region 204 from above, which may at least partially cooperate with the pumping liner and substrate support in a raised position to generally define the processing region. Faceplate 315 may operate as an electrode of the system for producing a local plasma within the processing region 204, and thus in some embodiments, faceplate 315 may be coupled with an electrical source or may be grounded. In some embodiments the substrate support 203 may operate as the companion electrode for generating a capacitively-coupled plasma between the faceplate and the substrate support.

A blocker plate 320 may be seated on the faceplate 315, which may further distribute processing fluids or precursors to produce a more uniform flow distribution to a substrate. Blocker plate 320 may also define a number of apertures through the plate. In some embodiments the blocker plate 320 may be characterized by a diameter less than a diameter of the faceplate as illustrated, which may provide an annular access on the surface of the faceplate radially outward from the blocker plate 320. In some embodiments a faceplate heater 325 may be seated on the annular access, and may contact faceplate 315 to heat the component during processing or other operations. In some embodiments, blocker plate 320 and faceplate heater 325 may be characterized together as having an outer radial diameter equal to or substantially equal to an outer radial diameter of faceplate 315. Similarly, faceplate heater 325 may be characterized as having an outer radial diameter equal to or substantially equal to an outer radial diameter of faceplate 315 in some embodiments. Faceplate heater 325 may extend about blocker plate 320, and may or may not directly contact blocker plate 320 on an outer radial edge of the blocker plate 320.

A gas box 330 may be positioned above the blocker plate 320, and the gas box 330 of each of the lid stacks 205 may at least partially support the second lid plate 210. Gas box 330 may define a central aperture that is aligned with an associated aperture 212 of the plurality of apertures defined through second lid plate 210. Second lid plate 210 may support a remote plasma unit 215 in some embodiments, which may include piping to each of the apertures 212, and into each processing region 204. Adapters may be positioned through apertures 212 to couple the remote plasma unit piping to the gas boxes 330. Additionally, isolation valves 220 may be positioned within the piping to meter flow to each individual processing region 204 in some embodiments.

O-rings or gaskets may be seated between each component of the lid stack 205, which may facilitate vacuum processing within chamber system 200 in some embodiments. The specific component coupling between the first lid plate 207 and the second lid plate 210 may occur in any number of ways, which may facilitate accessing system components. For example, a first set of couplings may be incorporated between the first lid plate 207 and the second lid plate 210, which may facilitate removal of both lid plates and each lid stack 205, which may provide access to the substrate supports or transfer apparatus within the transfer region of the chamber system. These couplings may include any number of physical and removable couplings extending between the two lid plates, which may allow them to be separated from the chamber body 207 as a whole. For example, a drive motor on a mainframe containing the chamber system 200 may be removably coupled with the second lid plate 210, which may lift the components away from the chamber body 201.

When the couplings between the first lid plate 207 and second lid plate 210 are disengaged, second lid plate 210 may be removed while first lid plate 207 may remain on chamber body 201, which may facilitate access to one or more components of the lid stacks 205. The break within the lid stack 205 may occur between any two components described previously, some of which may be coupled with first lid plate 207, and some of which may be coupled with second lid plate 210. For example, in some embodiments each of the gas boxes 330 may be coupled with second lid plate 210. Thus, when the second lid plate is lifted from the chamber system, the gas boxes may be removed, providing access to the blocker plate and faceplate. Continuing this example, the blocker plate 320 and faceplate 315 may or may not be coupled with the first lid plate 207. For example, although mechanical coupling may be included, the components may be decoupled and sit floating on the first lid plate 207, such as with locating features maintaining proper alignment of the components. It is to be understood that the example is intended to be non-limiting, and illustrative of any number of break configurations between any two components of the lid stack when the second lid plate 210 is separated from the first lid plate 207. Consequently, depending on the coupling between the first lid plate and second lid plate, the entire lid stack and both lid plates may be removed providing access to the transfer region, or the second lid plate may be removed providing access to the lid stack components.

Figure 4:
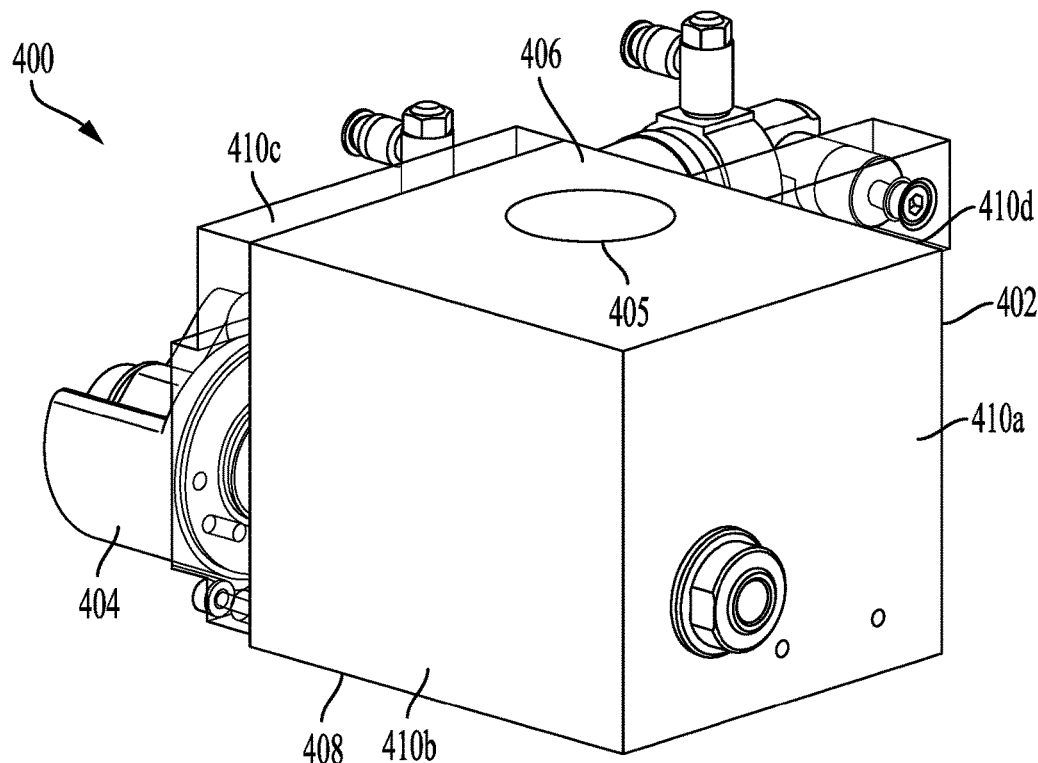
FIG. 4 shows a schematic front isometric view of an isolation valve according to some embodiments of the present technology.
Figure 5:
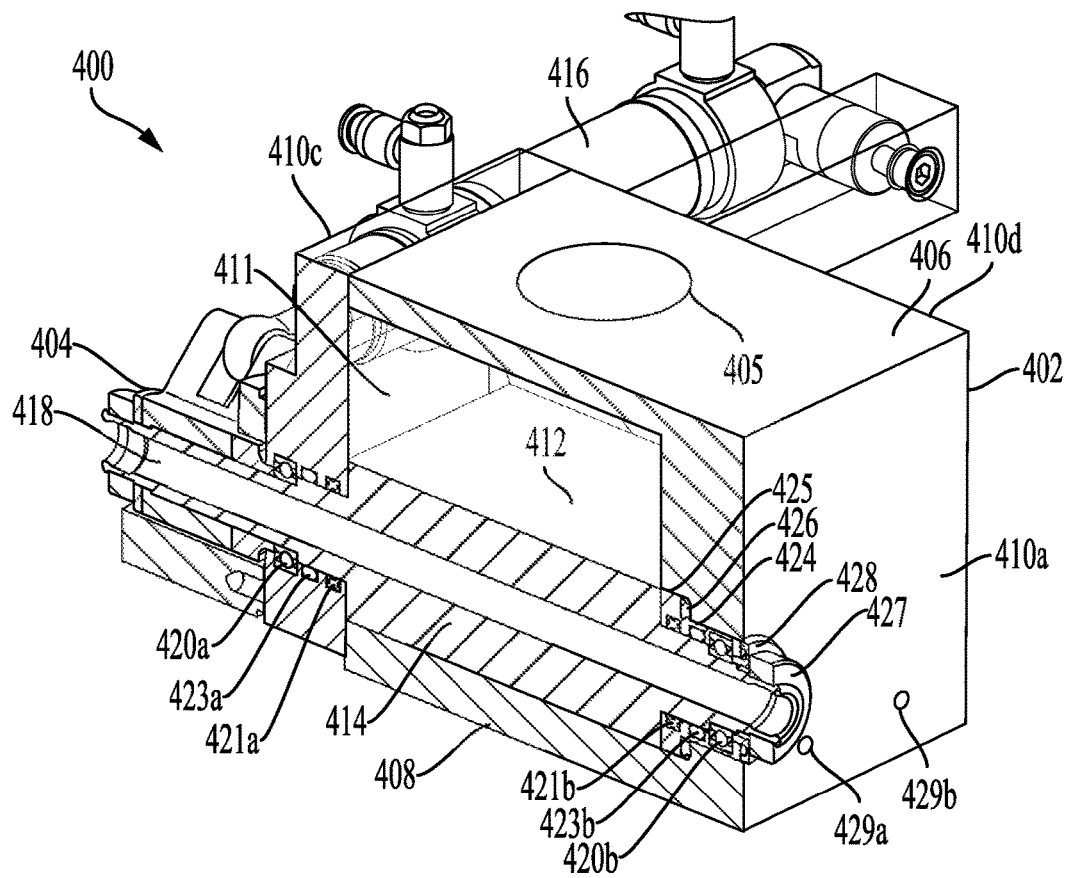
FIG. 5 shows a schematic cross-sectional isometric view of the isolation valve of FIG. 4.

FIG. 4 shows a schematic front isometric view of an isolation valve 400 according to some embodiments of the present technology. FIG. 5 shows a schematic cross-sectional isometric view of the isolation valve 400 of FIG. 4. The isolation valve 400 may be incorporated into a chamber system to fluidly connect and to provide fluid control between two chamber units. In some embodiments, similar to the isolation valve 220, the isolation valve 400 may be incorporated into a chamber system similar to the chamber system 200 to fluidly connect a remote plasma unit, such as the remote plasma unit 215, and a processing chamber or a processing region of a processing chamber, such as the processing region 204. Although two chamber units are described as an example, the isolation valve 400 may be configured to fluidly connect and to provide fluid control for more than two chamber units by using appropriate couplings, such as manifolds and/or piping. For example, in some embodiments, the isolation valve 400 may be configured to fluidly couple more than one chamber units upstream of the isolation valve 400 with a chamber unit downstream of the isolation valve 400. In some embodiments, the isolation valve 400 may be configured to fluidly couple a chamber unit upstream of the isolation valve 400 with more than one chamber units downstream of the isolation valve 400. In some embodiments, the isolation valve 400 may be configured to fluidly couple multiple chamber units upstream of the isolation valve 400 with multiple chamber units downstream of the isolation valve 400. Appropriate manifolds and/or piping may be utilized to couple the one or more chamber units upstream or downstream of the isolation valve 400 with an inlet or an outlet of the isolation valve 400.

The isolation valve 400 may include a valve body 402 and a flapper assembly 404. The valve body 402 may include a first or top wall 406, a second or bottom wall 408, a number of third or sidewalls 410a, 410b, 410c, 410d collectively defining an internal volume 411 (shown in FIG. 5) of the valve body 402. The valve body 402 may define in the top wall 406 a port, such as an inlet port 405, and may define in the bottom wall 408 another port, such as an outlet port 407 (not shown in FIGS. 4 and 5, shown in FIG. 6) for providing fluid access to the internal volume 411 of the valve body 402. Although positional or directional terms, such as top, bottom, side, are used herein for description, the terms are not intended to limit the orientation or configuration of the isolation valve 400 during assembly and/or operation. The isolation valve 400 may be configured in any orientation for incorporation into a chamber system and/or for coupling with other components of the chamber system.

In some embodiments, the inlet port 405 may be coupled with the remote plasma unit, such as the remote plasma unit 215, and the outlet port 407 may be coupled with the processing chamber or processing region, such as the processing region 204, as mentioned above. Thus, as will be discussed in more detail below, the isolation valve 400 may be configured to allow fluid flow, such as plasma effluents formed from a cleaning gas including $NF_3$, from the remote plasma unit to the processing region. The isolation valve 400 may also be configured to prevent fluid flow from the processing region, such as a processing gas which may or may not include plasma, to the remote plasma unit to prevent contamination of the remote plasma unit by the processing gas.

In some embodiments, the top wall 406, the bottom wall 408, and the sidewalls 410a, 410b, 410d may be formed as one unitary body. One of the sidewalls, e.g., sidewall 410c, may be formed as a separate piece and serve as a mounting platform for the flapper assembly 404. The sidewall 410c, with the flapper assembly 404 mounted thereon, may then be assembled with the unitary body of the top wall 406, the bottom wall 408, and the sidewalls 410a, 410b, 410d to form the isolation valve 400.

Specifically, with reference to FIG. 5, the flapper assembly 404 may include a flapper 412, a flapper shaft 414, and a driving mechanism 416. In some embodiments, the flapper 412 and the flapper shaft 414 may be formed as one single, unitary body. In some embodiments, the flapper 412 and the flapper shaft 414 may be formed as separate pieces and subsequently coupled to each other. To mount the flapper assembly 404 on the sidewall 410c, one end or a first end of the flapper shaft 414 may be positioned through an aperture formed in the sidewall 410c to be coupled with the driving mechanism 416, which may also be mounted on the sidewall 410c as will be discussed in more detail below.

One or more bearing supports 420a may be positioned around the flapper shaft 414 inside the aperture of the sidewall 410c to support the flapper shaft 414 and reduce rotational friction. In some embodiments, a single bearing support 420a may be used. In some embodiments, more than one bearing supports 420a may be used to improve the axial alignment between the flapper shaft 414 and the aperture of the sidewall 410c. The bearing support 420a may be positioned proximate the exterior of the sidewall 410c such that any exposure to the fluid flow, such as a corrosive gas flow, inside the internal volume 411 of the isolation valve 400 may be limited or avoided. Two sealing members 421a, 423a, such as elastomer seals, may be positioned around the flapper shaft 414 inside the aperture of the sidewall 410c. The sealing member 421a positioned closer to the interior of the sidewall 410c, and thus closer to the internal volume 411, may be made of or include a process resistant material, such as perfluoroelastomer (FFKM), to withstand or resist corrosion that may be caused due to exposure to, e.g., fluorine radicals or other corrosive gases, and/or exposure to high temperatures. The sealing member 423a positioned further away from the internal volume 411 may be made of or include a material that may be less chemical resistant as compared to the material of the sealing member 421a, but may provide superior sealing properties. In some embodiments, the sealing member 423a may be made of or include fluoroelastomer (FKM), Viton®, and the like. In some embodiments, the sealing members 421a, 423a may be made of or include a common material.

Once the flapper assembly 404 may be mounted on the sidewall 410c, the flapper 412 and the flapper shaft 414 may be positioned or slid inside the internal volume 411 of the isolation valve 400. The other end or a second end of the flapper shaft 414 may be positioned through an aperture formed in the sidewall 410a and be supported by the sidewall 410a. A seal sleeve 424 may be positioned around the flapper shaft 414 and inside the aperture of the sidewall 410a. The flapper shaft 414 may be configured to rotate relative to the seal sleeve 424 while the seal sleeve 424 may be static relative to the sidewall 410a. The interior surface of the sidewall 410a may define a recessed ledge around the aperture of the sidewall 410a configured to receive a flange 425 of the seal sleeve 424 such that the seal sleeve 424 and the flange 425 thereof may be flush with the interior surface of the sidewall 410c when the seal sleeve 424 may be fitted inside the aperture of the sidewall 410a. The flange 425 of the sealing sleeve 424 may include a groove for receiving therein a sealing member 426, such as an elastomer seal, to form a static seal between the seal sleeve 424 and the recessed ledge of the sidewall 410a.

The seal sleeve 424 may be configured to house one or more bearing supports 420b to support the flapper shaft 414. The bearing support 420b may be positioned proximate the exterior of the sidewall 410c such that any exposure to the fluid flow, such as a corrosive gas flow, inside the internal volume 411 of the isolation valve 400 may be limited or avoided. A nut 427 and a bearing washer 428 may be coupled with the end portion of the flapper shaft 414 to limit the relative axial movement between the bearing support 420b and the flapper shaft 414. Sealing members 421b, 423b, such as elastomer seals, may be positioned between the flapper shaft 414 and the seal sleeve 424. Similar to the sealing member 421a, the sealing member 421b positioned closer to the interior of the sidewall 410a, and thus closer to the internal volume 411, may be made of or include a process resistant material, such as perfluoroelastomer (FFKM), to withstand or resist corrosion that may be caused due to exposure to, e.g., fluorine radicals or other corrosive gases, and/or exposure to high temperatures. Similar to the sealing member 423a, the sealing member 423b positioned further away from the internal volume internal volume 411 may be made of or include a material that may be less chemical resistant as compared to the material of the sealing member 421b, but may provide superior sealing properties. In some embodiments, the sealing member 423b may be made of or include such as fluoroelastomer (FKM), Viton®, and the like. In some embodiments, the sealing members 421b, 423b may be made of or include a common material.

In some embodiments, additional sealing, such as elastomer sealing rings, may be provided between the interface or contacting surfaces of the sidewall 410c and the top wall 406, the bottom wall 408, and the sidewalls 410b, 410d, and fasteners may be used to further secure the sidewall 410c to the other walls. To disassemble or remove the flapper assembly 404, fasteners may be removed, the flapper shaft 414 may be pushed from the exterior side of the sidewall 410a, and the flapper 412 and the flapper assembly 404 may be slid out of and removed from the valve body 402.

Because the flapper assembly 404 may be mounted on and supported by the sidewall 410a and may be slid into the valve body 402 for assembly or slid out of the valve body 402 for disassembly, no additional connection may be required inside the isolation valve 400. Thus, when assembled, the components of the flapper assembly 404 that may be exposed to the fluid flow, such as the corrosive cleaning gas flow containing F radicals, may be limited. In some embodiments, only the flapper 412 and the flapper shaft 414 may be exposed to the fluid flow and no other components may be exposed to the fluid flow. By constructing the flapper 412 and the flapper shaft 414 with appropriate materials, degradation due to exposure to the fluid flow may be minimized, and operational life of the flapper assembly 404 and the isolation valve 400 may be improved.

In some embodiments, the flapper 412 and the flapper shaft 414, as well as the seal sleeve 424 and the valve body 402, may be made of the same or similar materials commonly used for making semiconductor processing chambers. The flapper 412, the flapper shaft 414, the seal sleeve 424, and/or the valve body 402 may be made of metal, such as aluminum with or without surface coating or treatments such as anodization, aluminum oxide, or aluminum nitride. Other suitable material for making the flapper 412, the flapper shaft 414, and/or the valve body 402 may be selected based on the fluid flow through the internal volume 411 of the isolation valve 400 and other various considerations.

In some embodiments, the isolation valve 400 may include optional cooling circuits to cool the flapper assembly 404 and/or the valve body 402. For example, in some embodiments, the fluid flow through the internal volume 411 of the isolation valve 400 may include plasma effluents, which may recombine and release heat, causing the flapper 412, flapper shaft 414, the valve body 402, and/or other components of the isolation valve 400 to heat up. In some embodiments, one or more of the sidewalls 410 may include two ports 429a, 429b for a cooling fluid, such as water, air, etc., to flow through a cooling loop disposed inside the valve body 402 for cooling the valve body 402. For example, the cooling loop may be disposed in the bottom wall 408 surrounding the outlet port 407 (shown in FIG. 6) of the isolation valve 400.

In some embodiments, the flapper shaft 414 may include a hollow core 418 for a cooling fluid, such as water, air, etc., to flow through to cool the flapper shaft 414. The flapper 412 may also be cooled by the cooling fluid supplied through the flapper shaft 414 via thermal conduction. In some embodiments, separate cooling circuit may be provided for the flapper 412 as well. As mentioned above, because no elastomer sealing may be exposed to the fluid flow, heating may be less of a concern. Further, depending on the manner in which the isolation valve 400 may be coupled with the chamber unit supplying the plasma effluents, recombination of radicals that may occur in the isolation valve 400 may be limited. For example, the isolation valve 400 may be incorporated in the chamber system 200 described above with reference to FIG. 2 to provide fluid control between the remote plasma unit chamber units 215 and a processing region 204. Thus, the isolation valve 400 may be disposed at an extended distance away from the remote plasma unit 215 provided by the piping connecting the remote plasma unit 215 and the isolation valve 400. Consequently, the recombination heat that may be produced in the isolation valve 400 may be significantly less as compared to when the remote plasma unit 215 may be coupled directly to the inlet port 405 of the isolation valve 400, and cooling for the flapper shaft 414, the flapper 412, and/or the valve body 402 may be omitted. When cooling may be omitted, the flapper shaft 414 may be made of a solid core, and the sidewall 410a may be formed with a recess instead of an aperture or through-hole as shown in FIG. 4 for receiving the end portion of the flapper shaft 414.

Figure 6:
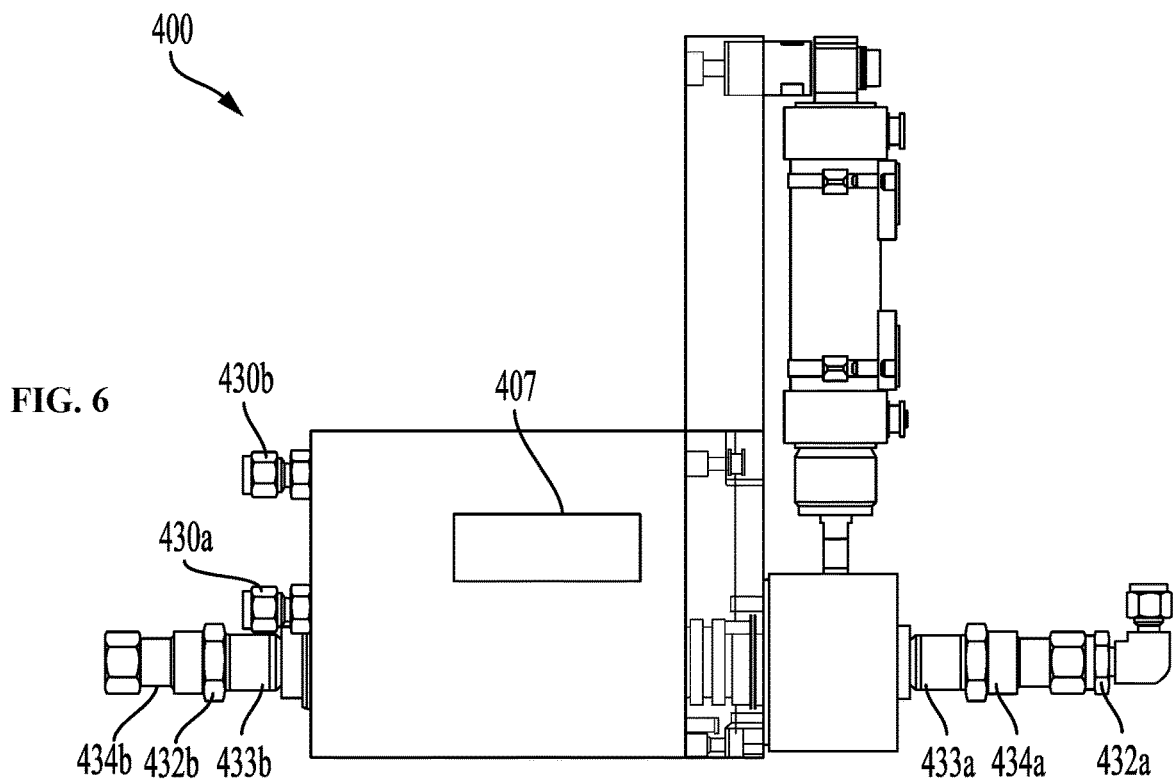
FIG. 6 shows a schematic bottom plan view of the isolation valve of FIG. 4.

FIG. 6 shows a schematic bottom plan view of the isolation valve 400 of FIG. 4. In addition to the various components shown in FIGS. 4 and 5, FIG. 6 shows the various couplings for connecting to the cooling fluid tubing, including the couplings 430a, 430b for connecting to the tubing for supplying the cooling fluid to cool the valve body 402, and the couplings 432a, 432b for connecting to the tubing for supplying the cooling fluid to cool the flapper shaft 414 and the flapper 412. In some embodiments, the couplings 432a, 432b for connecting to the tubing for supplying the cooling fluid to the flapper shaft 414 may include rotary couplings. For example, each of the couplings 432a, 432b may include a rotary feedthrough, such as a threaded rotary feedthrough 434a, 434b. By utilizing rotary feedthroughs 434a, 434b, when the flapper shaft 414 may be rotated to open or close the flapper 412, the tubing may not be rotated or twisted, and the stress or fatigue that may be otherwise caused by the rotation of the flapper shaft 414 may be avoided. In some embodiments, each of the couplings 432a, 432b may further include an adaptor 433a, 433b for coupling the rotary feedthrough 434a, 434b and the other components of the coupling 432a, 432b with the flapper shaft 414. The adaptors 433a, 433b may be made of a polymer material to protect the flapper shaft 414 from galvanic corrosion. Some suitable polymer material for the adaptors 433a, 433b may include polytetrafluoroethylene (PTFE), polyamides, acrylonitrile butadiene styrene (ABS), polylactic acid (polylactide), polybenzimidazole (PBI), polycarbonate (PC), polyether sulfone (PES), polyoxymethylene (POM), polyetherether ketone (PEEK), polyetherimide (PEI), polyethylene (PE), polyphenylene oxide (PPO), polyphenylene sulfide (PPS), polypropylene (PP), polystyrene (PS), polyvinyl chloride (PVC), low density polyethylene (LDPE), high density polyethylene (HDPE), and the like.

Figure 7:
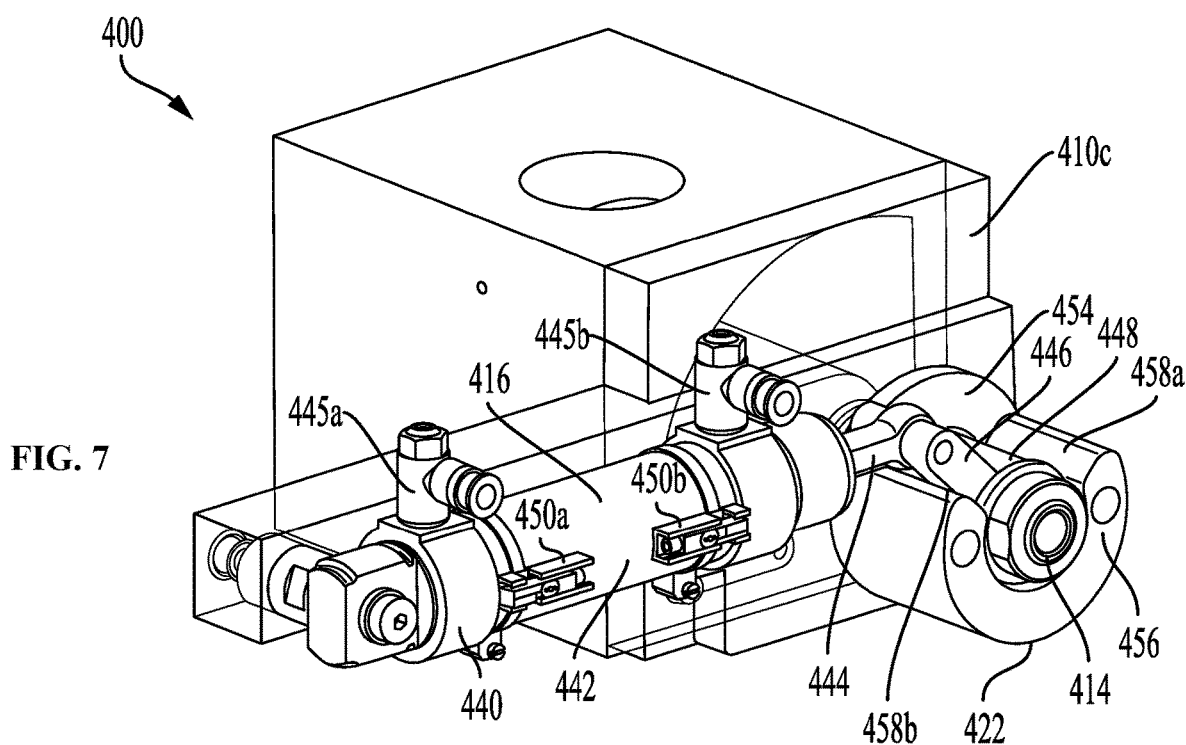
FIG. 7 shows a schematic back isometric view of the isolation valve of FIG. 4.

FIG. 7 shows a schematic back isometric view of the isolation valve 400 of FIG. 4. As shown, the driving mechanism 416 may include a pneumatic actuator 440. The pneumatic actuator 440 may include a pivot end that may be connected to an extended portion of the sidewall 410c and be supported thereby. The pneumatic actuator 440 may include a housing 442, a piston inside the housing, and a piston rod 444 coupled with the piston and extending outside the housing 442 for rotating the flapper shaft 414. The piston may be driven to move linearly inside the housing 442 by pressurizing one side of the piston and evacuating the other side the piston or vice versa via two valve pilot connections 445a, 445b positioned on either side of the piston.

The piston rod 444 may be linked to or coupled with a crank arm 446 extending from a sleeve 448 positioned around the end portion of the flapper shaft 414. The sleeve 448 may be fixedly coupled with the flapper shaft 414 such that the linear motion of the piston of the pneumatic actuator 440 may be translated into rotation of the crank arm 446, the sleeve 448, and the flapper shaft 414 to pivot the flapper 412 between a first or opened position to allow fluid flow through the isolation valve 400 and a second or closed positioned to restrict fluid flow through the isolation valve 400. The pneumatic actuator 440 may further include positional sensors 450a, 450b, such as hall effect sensors, for sensing the position of the piston inside the housing 442 for determining the position of the flapper 412 inside the isolation valve 400. Although a pneumatic actuator 440 is described as an example, other driving mechanism may be implemented, such as bellows with a sliding seal, a rack and pinion style drive, and any other suitable driving mechanisms.

In some embodiments, the driving mechanism 416 may further include a collar 422 mounted on the sidewall 410c. The collar 422 may include an annular flange 454 positioned around the sleeve 448. The collar 422 may further include an annular sector 456 that may define two hard stops 458a, 458b that may define the range of rotation of the crank arm 446. In some embodiments, the collar 422 may be configured such that when the crank arm 446 may be positioned adjacent or stopped at one of the hard stops, such as hard stop 458a, the flapper 412 may be in the opened position, and when the crank arm 446 may be positioned adjacent or stopped at the other one of the hard stops, such as hard stop 458b, the flapper 412 may be in the closed position.

In the embodiment shown, the entire driving mechanism 416 may be positioned to the exterior of the valve body 402. The driving mechanism 416 can thus be easily removed and/or exchanged for maintenance or repair without having to disconnecting the isolation valve 400 from the chamber system into which the isolation valve 400 may be incorporated. The driving mechanism 416 may be maintained or repaired without breaking vacuum of the chamber system. Further, because the flapper 412 may be actuated by the pneumatic actuator 440 and the position of the flapper 412 may be determined by the positional sensors 450 of the pneumatic actuator 440, no internal valve harnessing may be needed, simplifying the design and operation of the flapper 412. Integration of the isolation valve 400 into a chamber system may also be simplified in some embodiments because no integration of separate flapper control may be needed, and only coupling between the gas panel of the chamber system and the valve pilot connections 445a, 445b may be needed. Although a pneumatic actuator is shown and described as an example, in some embodiments, the driving mechanism 416 may include a servo motor coupled to the flapper 412 to control the motion and/or position of the flapper 412. As will be discussed in more detail below, a low-conductance gap may be created and/or maintained between the flapper 412 and surface(s) near or adjacent to the flapper 412 when the flapper 412 may be in the closed position. A servo motor may control and/or maintain the size of the gap with a high agree of precision.

Figure 8:
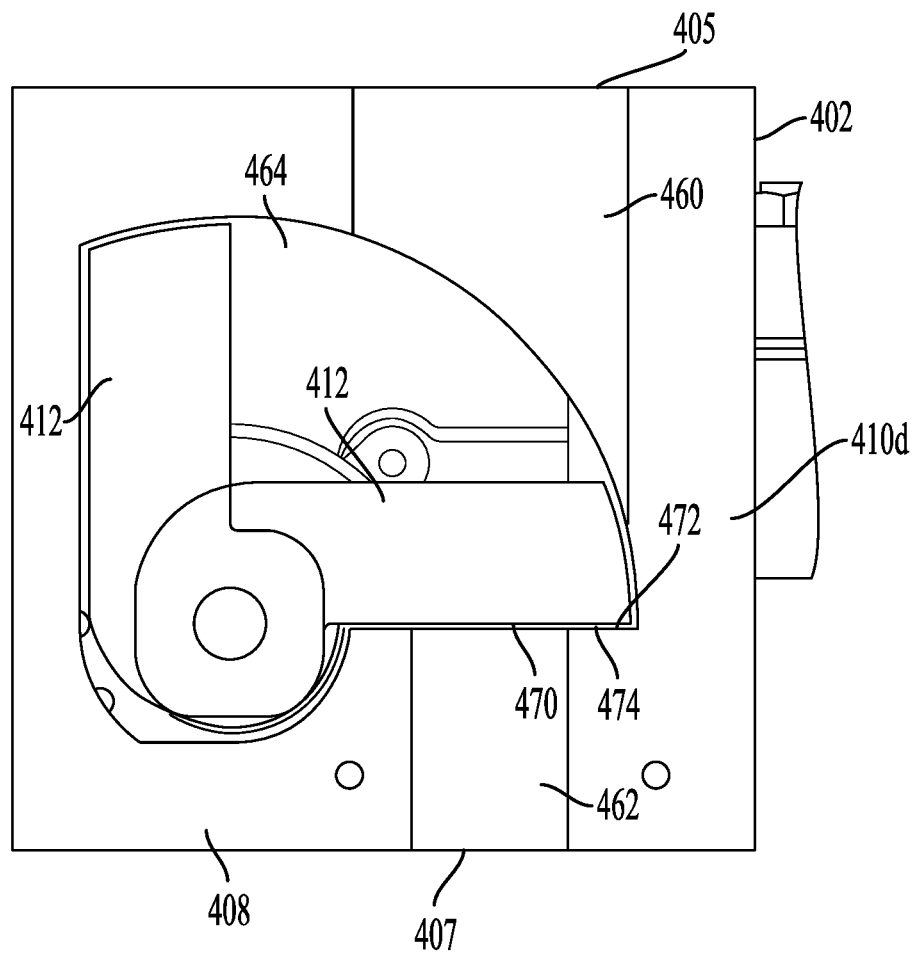
FIG. 8 shows a schematic see-through side view of a portion of the isolation valve of FIG. 4.

FIG. 8 shows a schematic see-through side view of a portion of the isolation valve 400 of FIG. 4. For purpose of illustration and to aid understanding, FIG. 8 illustrates both the opened position (shown as a vertical position in FIG. 8) and the closed position (shown as a horizontal position in FIG. 8) of the flapper 412, although it is to be understood that the isolation valve 400 may include only one flapper 412. As shown, the valve body 402 may define a first fluid volume 460 and a second fluid volume 462. The valve body 402 may further define a third or swing volume 464 within which the flapper 412 may swing or pivot. The first fluid volume 460 and the swing volume 464 may overlap.

When the flapper 412 may be pivoted to the opened position, fluid may flow from the inlet port 405 into the first fluid volume 460, the second fluid volume 462, and exit the isolation valve 400 through the outlet port 407. For example, plasma effluents, such as plasma effluents formed from a cleaning gas by a remote plasma unit, may be flowed from the remote plasma unit into the first fluid volume 460 and the second fluid volume 462 via the inlet port 405, and then may be flowed via the outlet port 407 into a processing region for cleaning the various components in the processing region and downstream of the processing region. Although fluid flow from the inlet port 405 to the outlet port 407 is described as an example when the flapper 412 may be in the opened position, in some embodiments, fluid may flow from the outlet port 407 to the inlet port 405 passing through the second fluid volume 462 and the first fluid volume 460 depending on the operation.

When the flapper 412 may be pivoted to the closed position, fluid flow from the inlet port 405 to the outlet port 407 and vice versa may be restricted. For example, during semiconductor processing, a processing gas may be flowed in the processing region for processing a semiconductor substrate housed therein. The flapper 412 may be pivoted to the closed position to limit the process gas that may be flowed into and contaminate the remote plasma unit. As will be discussed in more detail below, a shielding gas may be flowed to further limit and prevent any process gas that may be flowed through the isolation valve 400 into the remote plasma unit.

With further reference to FIG. 8, the inlet port 405 and the outlet port 407 may be shaped differently, and the first fluid volume 460 and the second fluid volume 462 may include different cross sections. The inlet port 405 may be circular (as shown in, e.g., FIGS. 4 and 5), and at least the portion of the first fluid volume 460 proximate the inlet port 405 may have a circular cross section corresponding to the inlet port 405. The outlet port 407 may be rectangular (as shown in, e.g., FIG. 6), and the entire second fluid volume 462 may have a rectangular cross section corresponding to the outlet port 407. Although the outlet port 407 may be shaped differently from the inlet port 405, the outlet port 407 may define the same or similar flow cross-sectional area as the inlet port 405 to facilitate fluid flow through the isolation valve 400.

Figure 9:
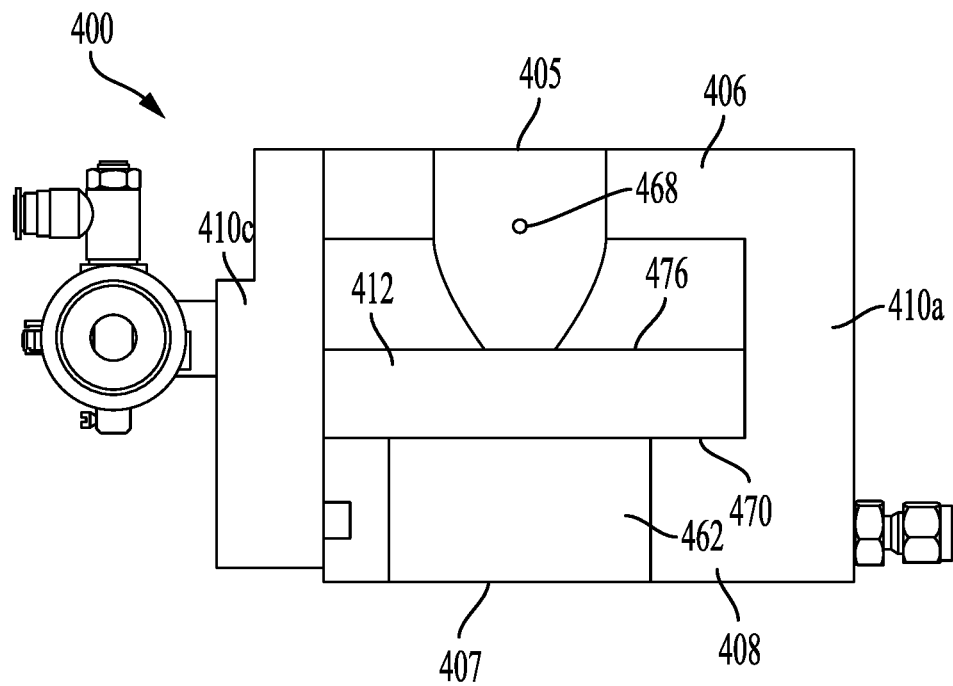
FIG. 9 shows a schematic cross-sectional front view of the isolation valve of FIG. 4.

The outlet port 407 and/or the second fluid volume 462 may include a first dimension or width that may be less than the diameter of the inlet port 405 as shown in FIG. 8. With reference to FIG. 9, which shows a schematic cross-sectional front view of the isolation valve 400 with the flapper 412 in the closed position, the outlet port 407 and/or the second fluid volume 462 may include a second dimension or length that may be greater than the diameter of the inlet port 405. The length may be parallel to the pivoting axis of the flapper 412, and the width may be perpendicular to the pivoting axis of the flapper 412. A length-to-width aspect ratio of the outlet port 407 and/or the second fluid volume 462 may range between about 10:1 and about 1:1, between about 8:1 and about 1:1, between about 6:1 and about 1:1, between about 5:1 and about 1:1, between about 4:1 and about 1:1, between about 3:1 and about 1:1, or between about 2:1 and about 1:1. Although a rectangular outlet port 407 and/or a rectangular cross section of the second fluid volume 462 are described as examples, the outlet port 407 and/or the cross section of the second fluid volume 462 may include a different shape, such as an oval or other oblong or elongate shape. In some embodiments, the outlet port 407 and/or the second fluid volume 462 may not have an elongate shape, and in some embodiments, the first dimension or width of the outlet port 407 and/or the second fluid volume 462 may be the same as or greater than the second dimension or length thereof.

By having a greater first or length dimension parallel to the pivoting axis of the flapper 412, a reduced second or width dimension perpendicular to the pivoting axis of the flapper 412 may be utilized to maintain the same or similar flow cross-sectional area as the inlet port 405. The radial span or length of the flapper 412 that may be required to cover the second fluid volume 462 may thus be reduced. The reduced length of the flapper 412 may in turn lead to a reduced pivoting or swing radius of the flapper 412 and a reduced swing volume 464 inside the valve body 402 for accommodating the flapper 412. Thus, an overall more compact or reduced packaging size of the isolation valve 400 may be achieved. In some embodiments, an exterior dimension of the isolation valve 400 as measured along the flow path or the distance between the inlet port 405 and the outlet port 407 may be less than or about 150 mm, less than or about 140 mm, less than or about 130 mm, less than or about 120 mm, less than or about 110 mm, less than or about 100 mm, or less.

With continued reference to FIGS. 8 and 9, when the flapper 412 may be in the closed position, a flapper surface 470 or the surface of the flapper 412 facing the outlet port 407 may be positioned in close proximity to a seating surface 472 defined by the bottom wall 408 of the valve body 402 surrounding the second fluid volume 462. In some embodiments, the flapper surface 470 may not contact the seating surface 472, and a small gap 474 may be maintained between the flapper surface 470 and the seating surface 472. In some embodiments, the gap 474 may extend or be present between the free end of the flapper 412 and the sidewall 410d defining a portion of the swing volume 464. The gap 474 may also extend or be present between the side surfaces of the flapper 412 and the sidewalls 410a, 410c as shown in FIG. 9.

Although a flat or planar flapper surface 470 and a flat or planar seating surface 472 are shown, the flapper surface 470 and the seating surface 472 may not be flat or planar in some embodiments. In some embodiments, the seating surface 472 may have a convex profile, and the flapper surface 470 may have a complimentary concave profile or vice versa. The seating surface 472 and the flapper surface 470 may have any other profile, although complimentary surface profiles of the flapper surface 470 and the seating surface 472 may help to achieve a lower fluid conductance through the gap 474 as discussed below.

In some embodiments, the flapper 412 and the valve body 402 may be configured such that, when the flapper 412 may be in the closed position, the gap 474 may be sufficiently small, and the flow path between the first fluid volume 460 and the second fluid volume 462 through the gap 474 may be sufficiently long such that a low fluid conductance between the first fluid volume 460 and the second fluid volume 462 through the gap 474 may be achieved. In some embodiments, the gap 474, such as the distance between flapper surface 470 and the seating surface 472, may range between about 2 mm and about 0.1 mm, between about 1.5 mm and about 0.5 mm, or between about 1.2 mm and about 0.8 mm. In some embodiments, the gap 474 may be less than or about 2 mm, less than or about 1.9 mm, less than or about 1.8 mm, less than or about 1.7 mm, less than or about 1.6 mm, less than or about 1.5 mm, less than or about 1.4 mm, less than or about 1.3 mm, less than or about 1.2 mm, less than or about 1.1 mm, less than or about 1.0 mm, less than or about 0.9 mm, less than or about 0.8 mm, less than or about 0.7 mm, less than or about 0.6 mm, less than or about 0.5 mm, less than or about 0.4 mm, less than or about 0.3 mm, less than or about 0.2 mm, less than or about 0.1 mm.

To achieve a relatively low fluid conductance, the second fluid volume 462 and the flapper 412 may be configured such that when the flapper 412 may be closed, the distance between the periphery of the second fluid volume 462 and the periphery of the flapper surface 470 may be greater than or about 5 mm, greater than or about 10 mm, greater than or about 15 mm, greater than or about 20 mm, greater than or about 25 mm, greater than or about 30 mm, or greater, but may be less than or about 50 mm in some embodiments to maintain a relatively small packaging size. Increased flow path may also be achieved by an appropriate thickness of the flapper 412. As discussed above, the gap 474 may also extend or be present between the side surfaces of the flapper 412 and the sidewalls 410a, 410c of the valve body 402 as shown in FIG. 9. The thickness of the flapper 412, as measured between the flapper surface 470 facing the outlet port 407 and the flapper surface 476 facing the inlet port 405, may range between about 5 mm and about 50 mm, between about 10 mm and about 40 mm, or between about 20 mm and about 30 mm in various embodiments.

Depending on the configuration of the flapper 412 and the valve body 402, in some embodiments, the flow path between the first fluid volume 460 and the second first fluid volume 462 via the gap 474 may range between about 100 mm and about 10 mm, between about 90 mm and about 20 mm, between about 80 mm and about 30 mm, or between about 70 mm and about 40 mm. In some embodiments, the flow path may be greater than or about 10 mm, greater than or about 20 mm, greater than or about 30 mm, greater than or about 40 mm, greater than or about 50 mm, greater than or about 60 mm, greater than or about 70 mm, greater than or about 80 mm, greater than or about 90 mm, greater than or about 100 mm, or greater. In some embodiments, a ratio of the flow path to the gap 474 may range between about 1000:1 and about 10:1, between about 500:1 and about 20:1, between about 200:1 and about 20:1, between about 100:1 and about 30:1, between about 80:1 and about 30:1, or between about 60:1 and about 40:1. In some embodiments, the ratio of the flow path to the gap 474 may be greater than or about 10:1, greater than or about 20:1, greater than or about 30:1, greater than or about 40:1, greater than or about 50:1, greater than or about 60:1, greater than or about 80:1, greater than or about 100:1, greater than or about 200:1, greater than or about 500:1, greater than or about 1000:1, or greater. In some embodiments, a gap 474 of less than or about 1 mm and a flow-path-to-gap ratio of greater than or about 40:1 may achieve the desired low level of fluid conductance while keeping the manufacturing cost down.

With a relatively small gap 474 and/or relatively long flow path between the first fluid volume 460 and the second fluid volume 462 through the gap 474, the fluid conductance through the gap 474 may be low. In some embodiments, the fluid conductance through the gap 474 may range between about 0.5 liter per second and about 0.01 liter per second, between about 0.4 liter per second and about 0.02 liter per second, between about 0.3 liter per second and about 0.03 liter per second, between about 0.2 liter per second and about 0.04 liter per second, or between about 0.1 liter per second and about 0.05 liter per second. In some embodiments, the fluid conductance through the gap 474 may be less than or about 0.5 liter per second, less than or about 0.4 liter per second, less than or about 0.3 liter per second, less than or about 0.2 liter per second, less than or about 0.1 liter per second, less than or about 0.09 liter per second, less than or about 0.08 liter per second, less than or about 0.07 liter per second, less than or about 0.06 liter per second, less than or about 0.05 liter per second, less than or about 0.04 liter per second, less than or about 0.03 liter per second, less than or about 0.02 liter per second, less than or about 0.01 liter per second, or less.

To prevent any fluid flow from the second fluid volume 462 to the first fluid volume 460 via the gap 474, a shielding gas may be flowed into the first fluid volume 460. In some embodiments, the shielding gas may be flowed into the first fluid volume 460 via a shielding gas inlet 468, such as shown in FIG. 9. In some embodiments, the shielding gas inlet 468 may be provided at a different location to flow the shielding gas into the swing volume 464 first and then into the first fluid volume 460. The shielding gas inlet 468 may be provided in any of the sidewalls 410a, 410b, 410c, 410d or the top wall 406. In some embodiments, no separate shielding gas inlet may be provided, and the shielding gas may be flowed into the first fluid volume 460 through the inlet port 405.

Because of the low fluid conductance through the gap 474, although some processing gas may be present along the flow path in the gap 474, such as in the region near the second fluid volume 462, the processing gas may be concentrated in the second fluid volume 462, and little or substantially no processing gas may diffuse through the gap 474 into the first fluid volume 460 and/or subsequently into the remote plasma unit to cause contamination of the remote plasma unit. Similarly, the shielding gas may be concentrated in the first fluid volume 460, and little or substantially no shielding gas may diffuse through the gap 474 into the second fluid volume 462 and/or subsequently into the processing region. To limit the effect of any shielding gas that may flow into the second fluid volume 462 on the process being conducted in the processing region, the shielding gas may be an inert gas, such as helium, neon, argon, krypton, xenon, radon, nitrogen, or any other suitable gases that may be non-reactive with the processing gas. In some embodiments, a purge gas may be flowed into the second fluid volume 462 during semiconductor processing. The same gas may be used as the shielding gas and supplied into the first fluid volume 460.

In some embodiments, a centration of the processing gas at the inlet port 405, which may be measured as the ratio of the processing gas to the shielding gas, may be less than or about $1:10^6$, less than or about $1:10^7$, less than or about $1:10^8$, less than or about $1:10^9$, less than or about $1:10^{10}$, less than or about $1:10^{11}$, less than or about $1:10^{12}$, less than or about $1:10^{13}$, less than or about $1:10^{14}$, or less. In some embodiments, by utilizing the isolation valve 400 described herein, only a relatively small flow rate of the shielding gas may be utilized to achieve the desired processing gas concentration and to substantially prevent the processing gas from flowing into the remote plasma unit, even when the pressure in the processing region may be relatively high, such as greater than or about 1 torr, greater than or about 5 torr, greater than or about 10 torr, greater than or about 15 torr, or greater. In some embodiments, depending on the pressure in the processing region and/or other various considerations, the flow rate of the shielding gas may range between about 200 sccm and about 5 sccm, between about 150 sccm and about 10 sccm, between about 100 sccm and about 15 sccm, between about 80 sccm and about 20 sccm, or between about 60 sccm and about 40 sccm. In some embodiments, the shielding gas may be flowed at a flow rate of less than or about 200 sccm, less than or about 150 sccm, less than or about 100 sccm, less than or about 80 sccm, less than or about 60 sccm, less than or about 50 sccm, less than or about 40 sccm, less than or about 30 sccm, less than or about 20 sccm, less than or about 10 sccm, or less.

In some embodiments, one or more pressure transducers may be utilized to monitor the pressure in the first fluid volume 460 and/or the second fluid volume 462. In some embodiments, the one or more pressure transducers may be incorporated into the valve body 402, such as being mounted at one of the walls 406, 408, 410 defining the first fluid volume 460 and/or the second fluid volume 462. A closed loop control system may be implemented to dynamically control the flow rate of the shielding gas based on the pressure in the first fluid volume 460 and/or the pressure in the second fluid volume 462 such that the pressure in the first fluid volume 460 may be maintained to be no less or greater than the pressure in the second fluid volume 462 to limit or prevent any processing gas from entering into the first fluid volume 460. For example, the flow rate of the shielding gas may be dynamically controlled to maintain the pressure in the first fluid volume 460 to be greater than the second fluid volume 462 by between about 1% and about 20% in various embodiments to limit or prevent the flow of the processing gas into the first fluid volume 460. For example, the pressure in the first fluid volume 460 may be maintained to be greater than the pressure in the second fluid volume 462 by at least about 1%, at least about 2%, at least about 3%, at least about 4%, at least about 5%, at least about 6%, at least about 7%, at least about 8%, at least about 9%, at least about 10%, at least about 12%, at least about 14%, at least about 16%, at least about 18%, at least about 20%, or greater.

By creating a relatively small gap and a relatively long flow path utilizing the isolation valve described herein and utilizing a shielding gas, mechanical contact may not be required to achieve isolation, and a non-contact or contactless seal for isolating two chamber units, such as the remote plasma unit and the processing region, may be achieved. Because no contact may be required, an elastomer seal may not be needed, and the associated seal wear or degradation may be no longer an issue. The isolation valve may operate reliably in a highly corrosive environment. Further, many of the complexities inherent in supporting an elastomeric seal, such as cooling and protective shielding, may also avoided, which may simplify the design and lower the costs. It should be noted that the term "contactless" or "non-contact" used herein do not exclude the embodiments where the flapper surface 470 and the seating surface 472 may contact each other either due to manufacturing tolerances or due to various other consideration. Rather, the term "contactless" or "non-contact" are used herein merely intend to distinguish from conventional isolation valves where sealing is achieve via mechanical contact, such as the contact that may be formed between an elastomer seal and a seating surface.

Because the remote plasma unit and the processing region may be isolated by the isolation valve during processing, flow of the processing gas from the processing region to the remote plasma unit and the contamination thereof may be prevented. Even if the remote plasma unit may be contaminated due to various other causes, such contamination may be prevented from entering into the processing region by the isolation valve, thereby improving processing quality and production throughput.

Figure 10:
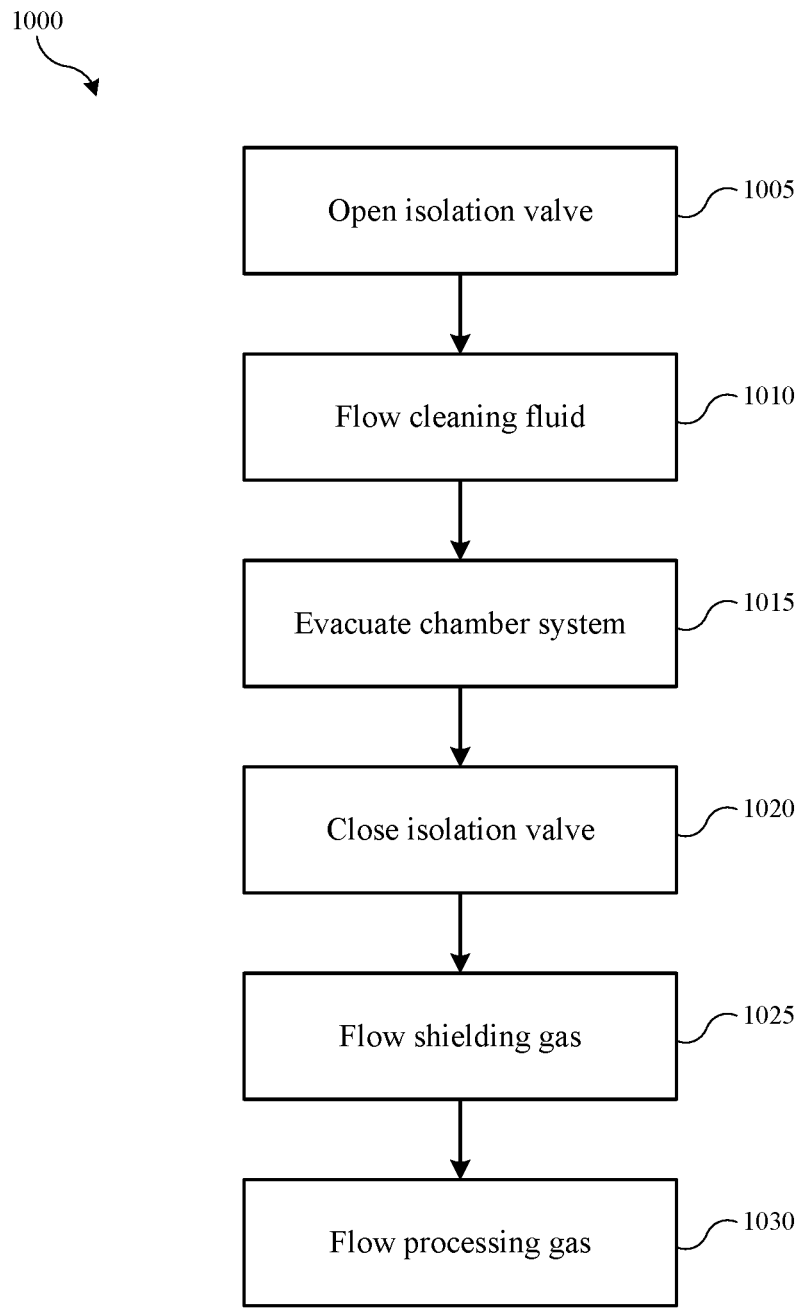
FIG. 10 shows exemplary operations in a method of operating an isolation valve to facilitate semiconductor processing according to embodiments of the present technology.

FIG. 10 shows exemplary operations in a method 1000 of operating the isolation valve 400 described herein to facilitate various semiconductor processing operations. As described above, the isolation valve 400 may be incorporated into a chamber system, such as chamber system 200, and coupled with two chamber units of the chamber system, such as a remote plasma unit upstream of the isolation valve and a processing region downstream of the isolation valve 400. The isolation valve 400 may be operated to facilitate the cleaning of the processing region using plasma effluents that may be produced by the remote plasma unit from a cleaning gas. The isolation valve 400 may be further operated to prevent contamination of the remote plasma unit by a process gas that may be flowed in the processing region during semiconductor processing.

Method 1000 may begin by opening the isolation valve 400, e.g., pivoting the flapper 412 of the isolation valve 400 to the opened position, at operation 1005 to allow fluid flow from the remote plasma unit to the processing region. At operation 1010, a cleaning fluid may be flowed from the remote plasma unit to the processing region via the isolation valve 400. The cleaning fluid may include plasma effluents formed by the remote plasma unit from a cleaning gas or gas mixture which may include $NF_3$ or other cleaning gases. The plasma effluents thus may include fluorine radicals or other highly corrosive cleaning radicals to clean the various chamber components in the processing region and downstream of the processing region. Upon completion of the cleaning operation, the chamber system may be evacuated at operation 1015 to remove any remaining cleaning plasma effluents. At operation 1020, the isolation valve 400 may be closed by pivoting the flapper 412 to the closed position. At operation 1025, a shielding gas may be flowed into the isolation valve 400 upstream of the flapper 412. The shielding gas may be flowed at any flow rate described above. At operation 1030, a processing gas may be flowed into the processing region to perform one or more semiconductor processing operations, such as deposition, etching, and so on, which may involve in-situ plasma formation in the processing region. As discussed above, the long flow path and small flow cross-sectional area defined by the flapper 412 and the seating surface 472 may operate as a non-contact, conductance-limiting seal. Consequently, when the shielding gas may be flowed, fluid flow from the processing region to the remote plasma unit or vice versa may be prevented, and contamination of one of the remote plasma unit or processing region by fluid flow from the other of the remote plasma unit or processing region may be prevented. In some embodiments, the flow rate of the shielding gas may be dynamically controlled and/or adjusted based on the pressure upstream of the flapper 412, e.g., the pressure of the remote plasma unit, and/or the pressure downstream of the flapper 412, e.g., the pressure of the processing region, such that the pressure upstream of the flapper 412 may be maintained to be no less or greater than the pressure downstream of the flapper 412 to limit or prevent any processing gas from entering into the remote plasma unit.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An isolation valve, comprising:
  a valve body defining:
    a first fluid volume,
    a second fluid volume,
    a bottom wall defining a seating surface and an outlet port that is fluidly coupled with the second fluid volume,
    a shielding gas inlet that is fluidly coupled with the first fluid volume,
    a first sidewall defining a first aperture and a second sidewall opposite to the first sidewall,
    wherein the second sidewall defines a second aperture; and
  a flapper assembly having a flapper disposed inside the valve body having a flapper surface complimentary to the seating surface, and a flapper shaft, wherein the flapper is pivotable within the valve body to a first position such that the flapper surface is away from the seating surface to allow fluid flow between the first fluid volume and the second fluid volume, wherein the flapper is further pivotable within the valve body to a fully pivoted position such that the flapper surface is parallel and proximate to the seating surface and planar across the outlet port to form a non-contact seal to restrict fluid flow between the first fluid volume and the second fluid volume to a low flow conductance, and wherein a first end portion of the flapper shaft is coupled with the first aperture and a second end portion of the flapper shaft is coupled with the second aperture.

2. The isolation valve of claim 1, wherein when the flapper is in the fully pivoted position, a gap ranging between 2 mm and 0.1 mm is formed between the seating surface and the complimentary flapper surface to form the non-contact seal.

3. The isolation valve of claim 1, wherein when the flapper is in the fully pivoted position, a ratio of a length of a flow path defined by the flapper surface and the seating surface to a distance between the flapper surface and the seating surface ranges between 1000:1 and 10:1.

4. The isolation valve of claim 1, wherein the flapper surface and the seating surface are planar.

5. The isolation valve of claim 1, wherein the flapper shaft is configured to pivot the flapper between the first position and the fully pivoted position.

6. The isolation valve of claim 5, wherein the flapper assembly further comprises a driving mechanism operable to drive the flapper shaft, and wherein the driving mechanism is disposed outside the valve body and mounted on an exterior of the first sidewall.

7. The isolation valve of claim 5, wherein the flapper and the flapper shaft are formed as a unitary body.

8. The isolation valve of claim 1, wherein the flapper shaft comprises a hollow core configured to transport a cooling fluid to cool the flapper shaft and the flapper.

9. The isolation valve of claim 1, wherein the valve body comprises a plurality of walls, and wherein a cooling loop is disposed in at least one wall of the plurality of walls and configured to transport a cooling fluid to cool the valve body.

10. The isolation valve of claim 1, wherein the valve body further defines a first port for providing fluid access to the first fluid volume, wherein the first port and the outlet port define a common flow cross-sectional area, and wherein the first port and the outlet port are shaped differently.

11. The isolation valve of claim 10, wherein the first port is circular, and wherein the outlet port is rectangular.

12. The isolation valve of claim 10, wherein the outlet port includes a first dimension parallel to a pivoting axis of the flapper and a second dimension perpendicular to the pivoting axis of the flapper, and wherein a ratio of the first dimension to the second dimension ranges between 10:1 and 1:1.

13. The isolation valve of claim 1, wherein one or both of the valve body and the flapper comprises at least one material selected from a group consisting of aluminum, aluminum oxide, and aluminum nitride.

14. A chamber system, comprising:
a first chamber unit;
a second chamber unit; and
an isolation valve coupled to the first chamber unit and the second chamber unit and configured to control fluid flow between the first chamber unit and the second chamber unit, wherein the isolation valve comprises:
a valve body defining a first port providing fluid access to the first chamber unit, and a bottom wall defining a seating surface and a second port providing fluid access to the second chamber unit, wherein the first port is fluidly coupled with a first fluid source, and a shielding gas source is in fluid contact with the first port or a shielding gas inlet that is fluidly coupled with the first chamber unit; and
a flapper disposed inside the valve body having a flapper surface, wherein the flapper is pivotable within the valve body to a first position such that the flapper surface is away from the seating surface defined by the valve body to allow fluid flow between the first chamber unit and the second chamber unit, wherein the flapper is further pivotable within the valve body to a fully pivoted position such that the flapper surface is parallel and proximate to the seating surface and planar across the second port to restrict fluid flow between the first chamber unit and the second chamber unit, wherein when the flapper is in the second position, the seating surface and the flapper surface form a non-contact seal to restrict fluid flow between the first chamber unit and the second chamber unit to a low flow conductance.

15. The chamber system of claim 14, wherein when the flapper is in the fully pivoted position, a ratio of a length of a flow path defined by the flapper surface and the seating surface to a distance between the flapper surface and the seating surface ranges between 1000:1 and 10:1.

16. The chamber system of claim 14, wherein the first chamber unit comprises a remote plasma unit, and the second chamber unit comprises a semiconductor processing chamber configured to produce a local plasma with the second chamber unit for semiconductor processing.

17. The chamber system of claim 14, wherein the isolation valve is a first isolation valve, the chamber system further comprising a third chamber unit and a second isolation valve coupled to the first chamber unit and the third chamber unit and configured to control fluid flow between the first chamber unit and the third chamber unit.

18. A method, comprising:
closing an isolation valve coupled with a first chamber unit and a second chamber unit, wherein the isolation valve is operable to control fluid flow between the first chamber unit and the second chamber unit, wherein the isolation valve comprises:
a valve body defining an inlet port providing fluid access to the first chamber unit, a first fluid volume fluidly coupled with the first chamber unit, and a second fluid volume fluidly coupled with the second chamber unit, wherein the inlet port is fluidly coupled with a first gas source and a shielding gas source is in fluid contact with the inlet port or a shielding gas inlet that is fluidly coupled with the first fluid volume; and
a flapper disposed inside the valve body having a flapper surface, wherein the flapper is pivotable within the valve body to a first position such that the flapper surface is away from a seating surface defined by the valve body to allow fluid flow between the first chamber unit and the second chamber unit, wherein the flapper is further pivotable within the valve body to a fully pivoted position such that the flapper surface is proximate the seating surface to restrict fluid flow between the first chamber unit and the second chamber unit, wherein when the flapper is in the fully pivoted position, the seating surface and the flapper surface form a non-contact seal to restrict fluid flow between the first chamber unit and the second chamber unit; and
flowing a shielding gas into the first fluid volume when the flapper is in the fully pivoted position.

19. The method of claim 18, wherein the shielding gas is flowed at a flow rate ranging between 200 sccm and 5 sccm.

20. The method of claim 18, further comprising dynamically controlling a flow rate of the shielding gas such that a pressure in the first fluid volume is greater than a pressure in the second fluid volume.

* * * * *